(12) United States Patent
Yamada et al.

(10) Patent No.: US 12,148,870 B2
(45) Date of Patent: Nov. 19, 2024

(54) LED PACKAGE AND INTEGRATED LIGHT EMITTING DEVICE

(71) Applicant: NICHIA CORPORATION, Anan (JP)

(72) Inventors: Motokazu Yamada, Tokushima (JP); Yuichi Yamada, Anan (JP); Shinsaku Ikuta, Tokushima (JP); Takeshi Tamura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/050,896

(22) Filed: Oct. 28, 2022

(65) Prior Publication Data

US 2023/0096212 A1     Mar. 30, 2023

Related U.S. Application Data

(63) Continuation of application No. 17/103,719, filed on Nov. 24, 2020, now Pat. No. 11,489,097.

(30) Foreign Application Priority Data

Nov. 29, 2019  (JP) .................................. 2019-217545
Aug. 24, 2020  (JP) .................................. 2020-141081

(51) Int. Cl.
*H01L 33/60*     (2010.01)
*F21V 3/06*      (2018.01)
(Continued)

(52) U.S. Cl.
CPC .............. *H01L 33/60* (2013.01); *F21V 3/062* (2018.02); *H01L 33/54* (2013.01); *F21Y 2105/16* (2016.08); *F21Y 2115/10* (2016.08)

(58) Field of Classification Search
CPC ....... H01L 33/60; H01L 33/54; H01L 33/486; H01L 2933/0091; H01L 33/46;
(Continued)

(56) References Cited

U.S. PATENT DOCUMENTS 8,907,361 B2 *  12/2014  Kim ........................ H01L 33/54
                                                                      257/98
2006/0192216 A1    8/2006  Ono
                        (Continued)

FOREIGN PATENT DOCUMENTS

EP     2479812 A2      7/2012
JP     2003-188421 A   7/2003
                (Continued)

OTHER PUBLICATIONS

Non Final Office Action in the related U.S. Appl. No. 17/103,719, dated Mar. 14, 2022.

*Primary Examiner* — Tracie Y Green
(74) *Attorney, Agent, or Firm* — Global IP Counselors, LLP

(57) ABSTRACT

An LED package includes a light source, a light transmissive member, and a light reflecting layer. The light source includes a resin package, a light emitting element and a wavelength conversion material. The resin package includes first and second leads and a resin member. The resin package defines a recess having a bottom face defined by portions of the first and second leads, and a portion of the resin member, and a lateral wall defined by a portion of the resin member. The light emitting element is disposed on or above the bottom face in the recess. The wavelength conversion material is disposed in the recess. The light transmissive member is disposed on or above the light source. The light reflecting layer is disposed on or above the light transmissive member at least on an upper side along an optical axis of the light emitting element.

14 Claims, 15 Drawing Sheets

(51) Int. Cl.
*H01L 33/54* (2010.01)
*F21Y 105/16* (2016.01)
*F21Y 115/10* (2016.01)

(58) Field of Classification Search
CPC ......... H01L 33/58; H01L 33/48; H01L 33/50; H01L 33/56; H01L 33/62; F21V 3/062; F21Y 2105/16; F21Y 2115/10
See application file for complete search history.

(56) References Cited

U.S. PATENT DOCUMENTS

| | | |
|---|---|---|
| 2008/0224162 A1 | 9/2008 | Min et al. |
| 2010/0213475 A1* | 8/2010 | Son .................. H01L 33/48 257/89 |
| 2011/0089453 A1 | 4/2011 | Min |
| 2011/0278623 A1 | 11/2011 | Kobayakawa |
| 2012/0313131 A1* | 12/2012 | Oda .................. H01L 33/56 257/E33.072 |
| 2013/0121000 A1 | 5/2013 | Lee et al. |
| 2013/0300285 A1 | 11/2013 | Ito |
| 2015/0041844 A1 | 2/2015 | Okahisa et al. |
| 2015/0357527 A1 | 12/2015 | Tamaki et al. |
| 2016/0079507 A1 | 3/2016 | Lee et al. |
| 2016/0265741 A1 | 9/2016 | Yamada et al. |
| 2016/0380166 A1* | 12/2016 | Reiss .................. H01L 25/0753 257/88 |
| 2017/0122503 A1 | 5/2017 | Ozaki et al. |
| 2017/0125649 A1 | 5/2017 | Sato et al. |
| 2017/0154879 A1* | 6/2017 | Ozeki .................. H01L 33/60 |
| 2017/0162766 A1* | 6/2017 | Sato .................. H01L 33/54 |
| 2017/0179345 A1* | 6/2017 | Yamada .................. H01L 33/505 |
| 2018/0180249 A1 | 6/2018 | Yamada et al. |
| 2018/0219140 A1 | 8/2018 | Seki et al. |
| 2018/0309035 A1 | 10/2018 | Bando et al. |
| 2019/0006568 A1 | 1/2019 | Hayashi |
| 2019/0348574 A1 | 11/2019 | Wakaki |
| 2020/0006608 A1* | 1/2020 | Ozeki .................. H01L 33/52 |
| 2021/0057613 A1 | 2/2021 | Wakaki |
| 2021/0074693 A1* | 3/2021 | Sim .................. H01L 25/13 |
| 2021/0175398 A1* | 6/2021 | Kashihara .............. H01L 33/005 |

FOREIGN PATENT DOCUMENTS

| | | |
|---|---|---|
| JP | 2008-227485 A | 9/2008 |
| JP | 2010-165979 A | 7/2010 |
| JP | 2012-216785 A | 11/2012 |
| JP | 2013-106047 A | 5/2013 |
| JP | 2013115088 A | 6/2013 |
| JP | 2015035438 A | 2/2015 |
| JP | 2015043363 A | 3/2015 |
| JP | 2016171227 A | 9/2016 |
| JP | 2017084727 A | 5/2017 |
| JP | 2017117858 A | 6/2017 |
| JP | 2017157278 A | 9/2017 |
| JP | 2018-107279 A | 7/2018 |
| JP | 2018-125438 A | 8/2018 |
| JP | 2019009429 A | 1/2019 |
| JP | 2019-153785 A | 9/2019 |
| JP | 2019-197764 A | 11/2019 |
| KR | 101892593 B1 | 8/2018 |
| WO | 2012099145 A1 | 7/2012 |
| WO | 2013153945 A1 | 10/2013 |
| WO | 2014032924 A1 | 3/2014 |
| WO | 2014/119146 A1 | 8/2014 |

\* cited by examiner

LED PACKAGE AND INTEGRATED LIGHT EMITTING DEVICE

CROSS-REFERENCE TO RELATED APPLICATION

This application is a continuation application of U.S. patent application Ser. No. 17/103,719, filed on Nov. 24, 2020. This application claims priority to Japanese Patent Application No. 2019-217545 filed on Nov. 29, 2019, and Japanese Patent Application No. 2020-141081 filed on Aug. 24, 2020. The entire disclosures of U.S. patent application Ser. No. 17/103,719 and Japanese Patent Application Nos. 2019-217545 and 2020-141081 are hereby incorporated herein by reference.

BACKGROUND

The present disclosure relates to an LED package and an integrated light emitting device.

A light emitting device, which includes a reflecting or diffusing member disposed on the upper face of the transparent resin that encapsulates a light emitting element and allows light from the light emitting element to exit from the lateral faces of the transparent resin, has been in use. Such a light emitting device can be used as a light source of a backlight because of its ability to readily diffuse light in a lateral direction. See, for example, International Patent Application Publication No. WO2012/099145 and Japanese Patent Application Publication No. 2016-171227.

SUMMARY

In backlight applications, however, there is a need to more efficiently diffuse light in a lateral direction. One object of the present disclosure is to provide a light emitting device and a LED package that are capable of efficiently diffusing light in a lateral direction while the thickness of the device is reduced.

According to one embodiment of the present disclosure, an LED package includes a light source, a light transmissive member, and a light reflecting layer. The light source has an upper face serving as a light emission face. The light source includes a resin package, a light emitting element and a wavelength conversion material. The resin package includes a first lead, a second lead, and a resin member supporting the first lead and the second lead. The resin package defines a recess having a bottom face defined by a portion of the first lead, a portion of the second lead and a portion of the resin member, and a lateral wall defined by a portion of the resin member. The light emitting element is disposed on or above the bottom face in the recess. The wavelength conversion material is disposed in the recess. The light transmissive member is disposed on or above the light source. The light reflecting layer is disposed on or above the light transmissive member at least on an upper side along an optical axis of the light emitting element.

The present disclosure can provide a light emitting device and an LED package that are capable of more efficiently diffusing light in a lateral direction.

DESCRIPTION

Figure 1A:
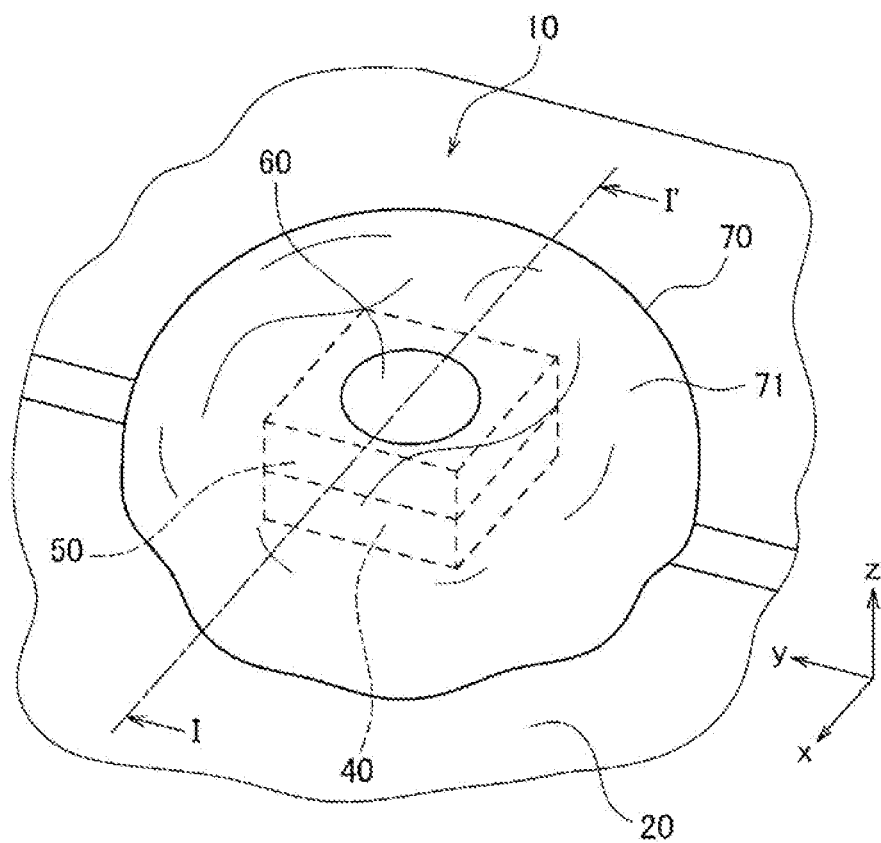
FIG. 1A is a schematic perspective view of a light emitting device according to one embodiment of the present disclosure.

Certain embodiments of the present disclosure will be explained below with reference to the accompanying drawings. The embodiments below, however, are exemplary illustrations provided for the purpose of giving shape to the technical ideas of the present invention, and are not intended to limit the present invention to those described below. The sizes and positional relationship of members shown in each drawing might be exaggerated for clarity of explanation. Furthermore, terms indicating specific directions or positions, e.g., "above/upper," "under/lower" and other phrases including these, might be used as needed. These terms are used for the purpose of making the disclosure easily understood based on the drawings being referred to, and the technical scope of the disclosure should not be limited by the meanings of these terms. For example, a top view is one viewed in the Z-axis direction indicated in FIG. 1A, and above/upper indicates a direction using the Z-axis as a reference. Furthermore, the same designations and reference numerals, as a basic rule, denote the same or similar members or components, for which a redundant explanation will be omitted as appropriate.

EMBODIMENTS

Figure 1B:
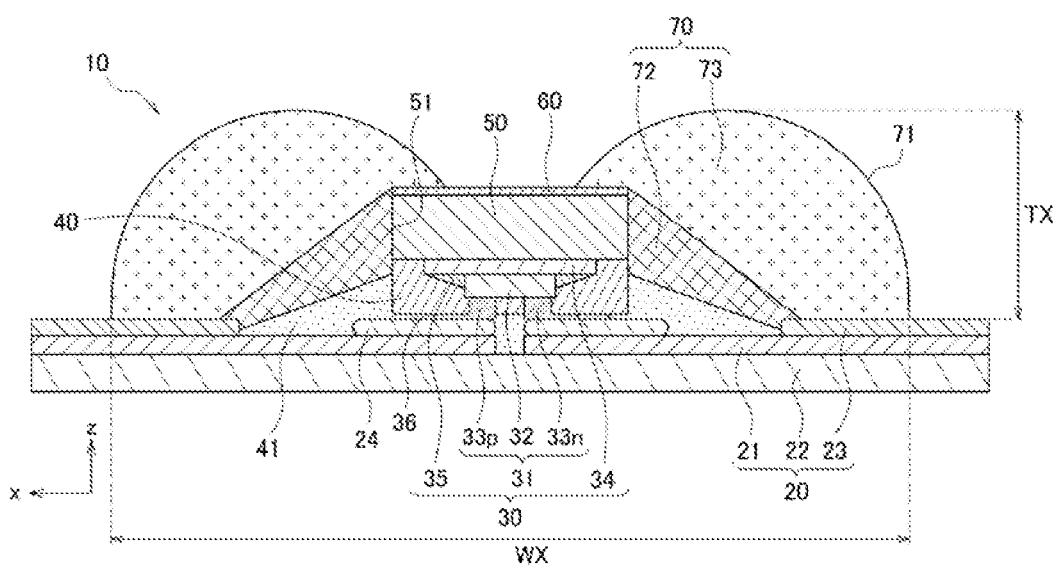
FIG. 1B is a schematic cross-sectional view taken along line I-I' in FIG. 1A.
Figure 1C:
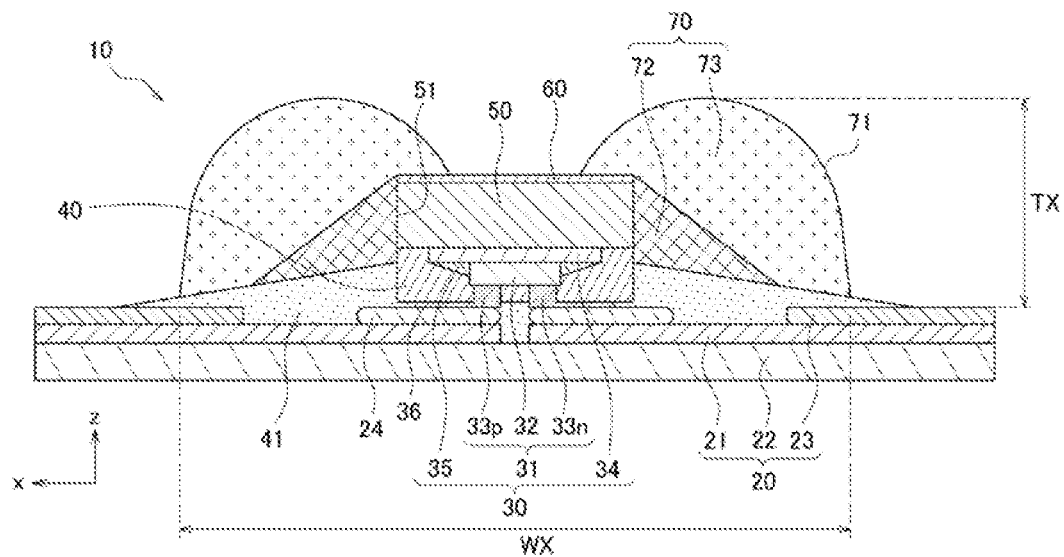
FIG. 1C is a schematic cross-sectional view of a light emitting device according to another embodiment of the present disclosure.

A light emitting device 10 according to one embodiment of the present disclosure, as shown in FIGS. 1A, 1B, and 1C, includes a substrate 20, a light source 30, a cover member 40, a light transmissive member 50, a light reflecting layer 60, and a light transmissive cover member 70. The light transmissive cover member 70 includes a lens part 71 and covers at least the lateral faces 51 of the light transmissive member 50. The light transmissive cover member 70 has such a shape that a portion above the perimeter of the light reflecting layer 60 has a larger thickness than a portion above the light reflecting layer 60 where the optical axis of the light emitting element 31 (described later) passes through. This includes a case in which the light transmissive cover member 70 exposes at least one portion of the upper face of the light reflecting layer 60, i.e., the upper face of the light reflecting layer 60 where the optical axis of the light emitting element 31 (denoted as A in FIG. 5B) passes through.

Providing a light transmissive cover member 70 having the unique shape described above may make it difficult for the light from the light source to exit upwards (directly above the light source) while allowing the light transmissive member 50 to internally propagate the light from the light source to be mainly output from the lateral faces of the light transmissive member 50. Accordingly, the light may be efficiently introduced into the light transmissive cover member 70. This, as a result, may achieve the lateral diffusion of light.

Furthermore, because the light transmissive cover member 70 has a thickness of 0 μm, or disposed in the form of a thin film, the height of the lens part 71 as a whole may be reduced above the central portion of the light reflecting layer. This may facilitate the thickness reduction of the light emitting device as compared to a light emitting device having a lens part which has the largest height above the central portion of the light reflecting layer.

Accordingly, in such a case of disposing the light emitting device directly under a light guide plate as a light source for a backlight, for example, lateral diffusion of light may be achieved while reducing the thickness of the device. This may improve the in-plane luminance uniformity of the emission face. This may also make it possible to reduce the number of light sources, thereby contributing to providing a lighter weight and inexpensive surface emitting device for use in a backlight or the like.

Substrate 20

A substrate 20 is a member on which a light source 30 is mounted, and includes wiring 21 for supplying power to the light source 30 and a base 22 on which the wiring 21 is disposed, as shown in FIG. 1. The substrate may optionally include a cover layer 23 partially covering the wiring 21.

The substrate 22 can be formed, for example, by using a resin, such as a phenol resin, epoxy resin, polyimide resin, BT resin, polyphthalamide (PPA), polyethylene terephthalate (PET), or the like, or ceramics. Among these examples, a resin can be used from the perspective of cost and formability. A ceramic can be used for the base 22 in order to produce a highly heat resistant and highly light resistant light emitting device. Examples of ceramics include alumina, mullite, forsterite, glass ceramics, nitrides (e.g., AlN), carbides (e.g., SiC), and the like. Among these examples, ceramics made of alumina or having alumina as a main component are preferable.

In the case of using a resin for the base 22, mixing an inorganic filler, such as glass fibers, $SiO_2$, $TiO_2$, $Al_2O_3$, or the like, in the resin can improve the mechanical strength, reduce the thermal expansion coefficient, and increase the reflectance. The substrate 20 can be configured as a metal member and insulating portion(s) formed thereon.

Wiring 21 is a member to be electrically connected to the electrodes of a light source 30 for supplying an electric current (power) from an external power supply, and is patterned to have at least two, positive and negative, spaced portions.

The wiring 21 is formed at least on the upper face of the base 20 which is the mounting face of the light source 30. The material for the wiring 21 can be suitably selected based on the material used for the base 22. For example, in the case of using a ceramic material for the base 22, a material having a high melting point capable of withstanding the firing temperature for the ceramic sheet can be used for the wiring 21. For example, high melting point metals, such as tungsten, molybdenum, and the like are preferable. The surface of the wiring may be further covered with a metal material such as nickel, gold, silver, or the like, by plating, sputtering, vapor deposition, or the like.

In the case of using a resin material for the base 22, a material that can be easily processed can be used for the wiring 21. In the case of forming the base 22 with an injection molded resin, a material that can be easily processed, such as by punching, etching, bending, or the like, as well as having a relatively high mechanical strength is used for the wiring 21. Examples include metal sheets or lead frames made of copper, aluminum, gold, silver, tungsten, iron, nickel, iron-nickel alloys, phosphor bronze, copper-iron alloys, molybdenum, or the like. The surface can be further covered by a metal material. Examples of metal materials include silver, or alloys of silver and copper, gold, aluminum, rhodium, or the like, of a single layer or multi-layer structure. The metal material can be applied by plating, sputtering, vapor deposition, or the like.

The cover layer 23 is normally formed of an insulating material. The cover layer 23 preferably covers the area on the wiring 21 except for the portions that will be electrically connected to the light source 30 and other components. The cover layer 23 can be formed of a material that barely absorbs the light from the light emitting element. Examples include epoxy, silicone, modified silicone, urethane, oxetane, acrylic, polycarbonate, polyimide, and the like. The cover layer 23 insulate the wiring, and in addition, may improve the light extraction efficiency by containing a white filler to reflect light while preventing light leakage and absorption. The cover layer may also improve the adhesion with the light transmissive cover member 70 in the case of being disposed in contact with the light transmissive cover member 70 as described later (see, for example, FIG. 1B).

Light Source 30

Figure 3A:
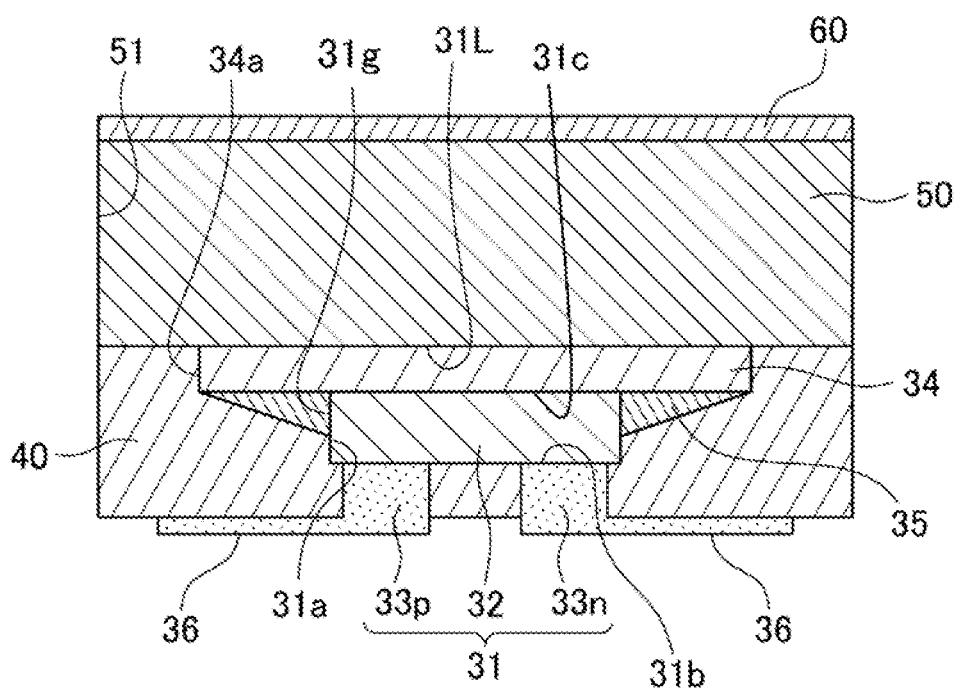
FIG. 3A is an enlarged schematic cross-sectional view of a portion of the light emitting device in FIG. 1B.

A light source 30 includes a light emitting element 31. The light source 30 is disposed on or above the substrate 20. In the case in which the light source 30 is configured only as a light emitting element 31, the upper face 31c of the light emitting element 31 becomes the emission face of the light source 30. In the description herein, as shown in FIG. 3A, the face of the light emitting element 31 on the substrate 20 side is denoted as the lower face 31b, the face opposite to the lower face is denoted as the upper face 31c, and the faces adjacent to the upper face 31c are denoted as the lateral faces 31a. The faces of other members might be similarly denoted as lateral, lower, and upper faces.

Figure 3B:
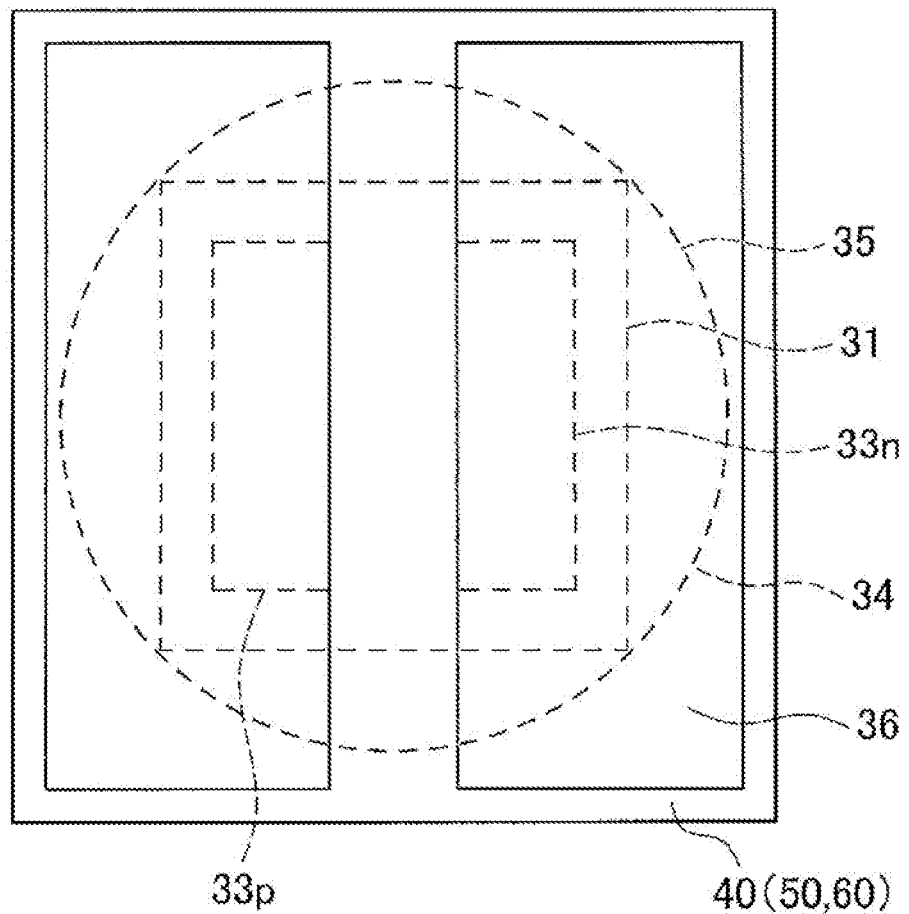
FIG. 3B is a schematic diagram when a portion of the light emitting device in FIG. 3A is viewed from the bottom.
Figure 4:
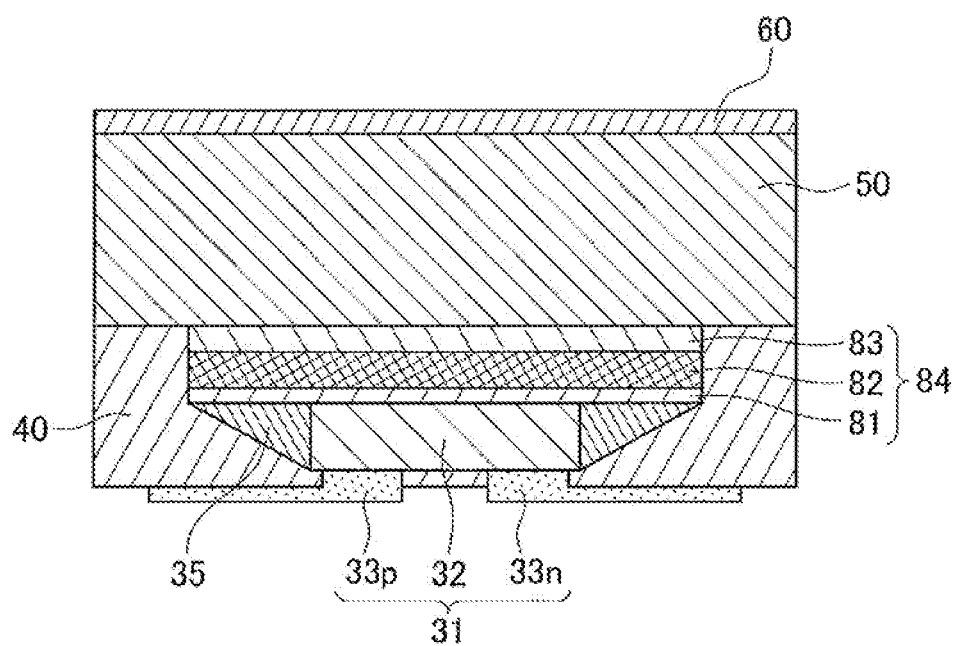
FIG. 4 is an enlarged schematic cross-sectional view of a portion of a light emitting device according to another embodiment.

As shown in FIG. 3A, FIG. 3B, and FIG. 4, the light source 30 preferably includes a wavelength conversion member 34 or 84 on the light emitting element 31. The light source 30 preferably further includes a fourth light transmissive member 35 that covers the lateral faces (31a in FIG. 3A) of the light emitting element 31.

Light Emitting Element 31

A light emitting element 31 includes a semiconductor stack 32 and a pair of electrodes 33p and 33n on one face of the semiconductor stack 32. The light emitting element 31 can have various planar shapes when viewed from the upper face 31c (from the emission face of the light source in the case in which the light source is configured only as the light emitting element), including a circle, ellipse, a polygon, such as a quadrangle, hexagon, or the like. Among these examples, the planar shape of the light emitting element 31 is preferably a quadrangle, particularly a square or one similar to that.

The semiconductor stack 32 includes semiconductor layers that include an emission layer. Furthermore, it may include a light transmissive substrate such as sapphire. The semiconductor stack includes a first conductivity type semiconductor layer (e.g., an n-type semiconductor layer), an emission layer (an active layer), and a second conductivity type layer (e.g., a p-type semiconductor layer). For a semiconductor layer that can emit ultraviolet light and visible light from blue to green light, for example, a Group III-V compound semiconductor, specifically a nitride-based semiconductor, such as $In_xAl_yGa_{1-x-y}N$ (0≤X, 0≤Y, X+Y≤1) or the like, can be used. For a semiconductor layer that can emit red light, a semiconductor, such as GaAs, GaAlAs, GaP, InGaAs, InGaAsP, or the like can be used. The thickness of the semiconductor stack 32 can be set, for example, as 3 μm to 500 μm.

The electrodes 33p and 33n can be of any material and structure known in the art, and have any thickness. The electrodes 33p and 33n can be formed as a single layer or multilayer film of metals, such as Au, Pt, Pd, Rh, Ni, W, Mo, Cr, Ti, Al, Cu, Sn, Fe, Ag, or alloys of these. Specifically, these electrodes can be formed as a stack of Ti/Rh/Au, Ti/Pt/Au, W/Pt/Au, Rh/Pt/Au, Ni/Pt/Au, Al—Cu alloy/Ti/Pt/Au, Al—Si—Cu alloy/Ti/Pt/Au, Ti/Rh, or the like stacked from the semiconductor layer side. Moreover, solder, such as AuSn, SnAgCu, SnPb or the like can be used. The electrodes 33p and 33n can have a thickness in a range of from 1 μm to 300 μm, for example, but preferably a thickness in a range of from 5 μm to 100 μm. The planar shape of the electrodes 33p and 33n can be appropriately determined.

The light emitting element 31 is electrically connected so as to face the electrodes 33p and 33n to the wiring 21 of the substrate 20. For such a connection, a metal layer 36 functioning as external connection terminals can be connected to the surfaces of the electrodes 33p and 33n of the light emitting element 31. The metal layer 36 preferably has a better resistance to corrosion and oxidation than the electrodes 33p and 33n. The metal layer 36 can be formed by using a high melting point metal, such as Ru, Mo, Ta, or the like. The thickness of the metal layer 36 can be set, for example, as 10 nm to 50 μm. The metal layer 36 can have the size that reaches the lateral faces of the light emitting device 10 at the lower face, but preferably has the size that is spaced apart from the lateral faces. The metal layer can be disposed, for example, so as to cover a portion of the lower face of the cover member 40 described later. This can allow the metal layer to be externally exposed at the lower face of the light emitting device as external connection terminals having larger areas than the electrodes of the light emitting element. In this manner, the light emitting element 31 or the light source 30 can be highly precisely mounted on the substrate 20 using a bonding material 24 such as solder. The metal layer can also enhance the bonding strength between the wiring and the light emitting element 31 or the light source 30.

Wavelength Conversion Member 34 or 84

A wavelength conversion member 34 or 84, contains a phosphor, and absorbs the light from the light emitting element 31 and converts it into light of a different wavelength. The wavelength conversion member 34 or 84 is disposed on or above the emission face (upper face 31c) of the light emitting element 31. The wavelength conversion member 34, 84 is positioned under the light transmissive member 50 described later. Disposing the wavelength conversion member 34 allows the light from the light emitting element 31 and the light from the wavelength conversion member 34 to enter the light transmissive member 50. In the case in which the light source 30 includes a light emitting element 31 and a wavelength conversion member 43 or 84, the upper face of the wavelength conversion member 43 or 84 becomes the emission face 31L of the light source 30.

The wavelength conversion member 34 or 84 preferably covers the entire emission face (upper face 31c) of the light emitting element 31. Preferably, as shown in FIG. 3A, the perimeter 34a of the wavelength conversion member 34 is positioned outward of the perimeter 31g of the light emitting element 31 in a top view. The planar shape of the wavelength conversion member can be circular, elliptical, or polygonal, such as quadrangular, hexagonal, or the like. The planar area of the wavelength conversion member 34, for example, is preferably larger than 100% of the planar area of the emission face (upper face 31c) of the light emitting element 31, but 200% at most, more preferably in the range of from 110% to 160%. The wavelength conversion member 34 is preferably disposed such that the center (or the center of gravity) is aligned with the center (or the center of gravity) of the emission face (the upper face 31c) of the light emitting element 31. This can make the width of the wavelength conversion member 34 overhanging the emission face (the upper face 31c) of the light emitting element 31 substantially constant, thereby reducing color non-uniformity. The wavelength conversion member 34 preferably is a sheet shaped member having an upper face and a lower face that are parallel with one another. The lateral faces can be perpendicular or oblique to the upper and lower faces, or curved faces.

The thickness of the wavelength conversion member 34 or 84 can suitably be selected in compliance with the type, amount, target chromaticity, or the like, of the phosphor employed. For example, the thickness of the wavelength conversion member 34 can be in the range of from 20 μm to 200 μm, preferably 100 μm to 180 μm.

The wavelength conversion member 34 or 84 can be one having a base material formed of a light transmissive resin material or glass which contains a phosphor as a wavelength conversion material, a ceramic containing a phosphor, or a single crystal phosphor. For the base material, thermosetting resins, such as silicone resins, silicone modified resins, epoxy resins, and phenol resins, thermoplastic resins, such as polycarbonate resins, acrylic resins, methylpentane resins, and polynorbornene resins, can be used. Particularly, silicone resins which excel in light resistance and heat resistance are suited. Examples of ceramics include sintered light transmissive materials such as aluminum oxide.

For phosphors, any that is known in the art can be used. Examples of phosphors excitable by a blue or UV light emitting element include cerium-activated yttrium aluminum garnet-based phosphors (YAG:Ce); cerium-activated lutetium aluminum garnet-based phosphors (LAG:Ce); europium and/or chromium-activated nitrogen-containing calcium aluminosilicate-based phosphors ($CaO-Al_2O_3-SiO_2$); europium-activated silicate-based phosphors (($Sr,Ba)_2SiO_4$); nitride-based phosphors, such as β-SiAlON phosphors, CASN-based phosphors, SCASN-based phosphors; KSF-based phosphors ($K_2SiF_6$:Mn); sulfide-based phosphors, quantum dot phosphors, and the like. By combining these phosphors and a blue or UV light emitting element, a light emitting device of various emission colors (e.g., white light emitting device) can be manufactured. These phosphors can be used singly or in combination. When used in combination, phosphors can be mixed to form a single layer, or individually contained in layers that are stacked. The wavelength conversion member can contain various fillers for viscosity adjustment purposes and the like.

For example, as shown in FIG. 4, in the case in which the wavelength conversion member 84 has a multilayer structure, a layer containing a filler is preferably disposed as the diffusion layer 83 as the uppermost layer. In this case, as the layers containing phosphors, a first layer 81 and a second layer 82 can contain different phosphors. For example, the second layer 82 can contain a KSF-based phosphor, and the first layer 81 can contain a β-SiAlON phosphor. Allowing multiple layers to contain different phosphors can improve the wavelength conversion efficiency by reducing mutual absorption, thereby producing a high optical output light emitting device. In the wavelength conversion member 84, the diffusion layer 83 can have a thickness, for example, of 50 µm to 200 µm, preferably 50 µm to 100 µm. The thickness of a layer containing a phosphor can be suitably adjusted in conformance with the type, content, and the like of the phosphor. For example, the thickness of the second layer 82 containing a KSF-based phosphor can be 50 µm to 500 µm, preferably 75 µm to 200 µm. The thickness of the first layer 81 containing a β-SiAlON phosphor can be 10 µm to 100 µm, preferably 20 µm to 80 µm.

The wavelength conversion member 34 or 84 can be disposed on or above the emission face (the upper face 31c) of the light emitting element 31 directly or via another material. In the case of disposing it directly, i.e., the wavelength conversion member 34 comes into contact with the emission face (the upper face 31c) of the light emitting element 31, for example, the wavelength conversion member can be disposed by direct bonding which joins the members at room temperature.

In the case of disposing it via another material, a light transmissive adhesive can be used. Such a light transmissive adhesive can, for example, entirely cover the lower face, which opposes the upper face, of the wavelength conversion member 34 as well as partially or entirely covering the lateral faces 31a of the light emitting element 31 as a fourth light transmissive member 35 in addition to being disposed between the wavelength conversion member 34 and the light emitting element 31. Covering the lateral faces 31a of the light emitting element 31 with the fourth light transmissive member 35 allows the light exiting the lateral faces 31a of the light emitting element 31 to be efficiently guided to the wavelength conversion member 34 and to the light transmissive member 50. Moreover, the wavelength conversion member 34 can be present on the lateral faces of the light emitting element 31. In this case, the lateral faces of the light source are configured as the lateral faces of the wavelength conversion member.

In the case of covering the lateral faces 31a of the light emitting element 31 with the fourth light transmissive member 35, the fourth light transmissive member 35 preferably has such a thickness from the lateral end of the light emitting element to the lateral end of the wavelength conversion member that is largest on the emission face side and becomes smaller towards the electrodes. Such a thickness gradient can be linear or curved depressing inwards. For example, the thickness of the fourth light transmissive member 35 from the lateral face of the light emitting element to the lateral face of the wavelength conversion member can be set to be equivalent to the length from the perimeter of the lower face of the wavelength conversion member 34 to the perimeter 31g of the emission face (the upper face 31c) of the light emitting element 31, on the emission face side. Accordingly, the light emitted from the lateral faces 31a of the light emitting element 31 enters the fourth light transmissive member 35 and reflected upwards (towards the emission face of the light emitting element 31) by the outer lateral faces of the fourth light transmissive member 35 to enter the light transmissive member 50. With such a fourth light emissive member 35, the light from the light emitting element 31 can efficiently enter the light transmissive member 50.

A light transmissive resin material can be used for the fourth light transmissive member 35. For example, a resin material is preferably composed of a thermosetting resin as a main component, such as a silicone resin, silicone modified resin, epoxy resin, phenol resin, or the like. The fourth light transmissive member 35 can have a transmittance of at least 70%, preferably at least 80%, more preferably at least 90%, for the light from the light emitting element.

Particularly, the fourth light transmissive member 35 preferably covers at least 50% of the lateral faces 31a of the light emitting element 31.

The fourth light transmissive member 35, as shown in FIG. 3B, preferably has substantially a circular outer shape on the emission face side. Such a shape allows it to efficiently guide the light emitted from the lateral faces 31a of the light emitting element 31 to the wavelength conversion member 34. The fourth light transmissive member 35 having such a shape can be formed on the sheet-shaped light transmissive member 50 described later by applying a liquid material for forming the fourth light transmissive member 35 by potting or the like.

Cover Member 40

A cover member 40 is a member that covers the lateral portions of the light source 30. The cover member 40 is formed of a resin material which contains a light reflecting substance.

In the case in which the light source 30 is configured only as a light emitting element 31, the cover member 40 preferably covers the lateral faces 31a of the light emitting element 31, as well as covering a portion of the lower face 31b of the light emitting element 31. The cover member 40 preferably covers the lower face 31b of the light emitting element 31 so as to expose at least a portion (the lower face opposite to the semiconductor stack) of each of the pair of electrodes 33p and 33n of the light emitting element 31.

In the case in which the light source 30 includes a light emitting element 31, a wavelength conversion member 34, and a fourth light transmissive member 35, the cover member 40 preferably covers the lateral faces of the light emitting element 31 directly or via another member. The cover member 40 preferably also covers the fourth light transmissive member 35. In the case in which there are portions of the lateral faces of the light emitting element 31 that are not covered by the fourth light transmissive member 35, the cover member 40 preferably covers the portions not covered by the fourth light transmissive member. The cover member 40 preferably covers the lateral faces of the wavelength conversion member 34 in part or whole, and the lower face of the wavelength conversion member 34 in part, more preferably the lateral faces of the wavelength conversion member 34 in whole, and the lower face of the wavelength conversion member 34 in part. Particularly, the cover member 40 more preferably covers in contact with the lateral faces 31a of the light emitting element 31, the fourth light transmissive member 35, the lateral faces of the wavelength conversion member 34 in whole and the lower face of the wavelength conversion member 34 in part.

In a case in which the light source 30 is configured only as a light emitting element 31, the upper face of the cover member 40 is preferably flush with the upper face 31c of the light emitting element 31. In the case in which the light source 30 includes a light emitting element 31 and a wavelength conversion member 34, the upper face of the cover member 40 is preferably flush with the upper face (emission face 31L) of the wavelength conversion member 34. Even in these cases, a slight difference in height, for example, about 1% to about 20% of the thickness of the wavelength conversion member 34, is allowed.

As described above, in the case in which the electrodes 33p and 33n are connected to a metal layer 36, the cover member 40 is preferably disposed so as not to cover the metal layer 36, in other words, the cover member 40 is disposed such that the metal layer 36 is interposed between the cover member 40 and the substrate.

The maximum thickness of the cover member 40 is preferably equivalent to the sum of the thicknesses of the light emitting element 31 and the wavelength conversion member 34. The thickness, for example, can be in the range of from 200 µm to 10000 µm, preferably 300 µm to 600 µm.

The cover member 40 can have a reflectance of at least 70% for the light from the light emitting element 31, preferably at least 80%, more preferably 90%.

Examples of resin materials for forming the cover member 40 include those having thermosetting resins, such as silicone resins, silicone modified resins, epoxy resins, phenol resins, and the like, as a main component. Examples of light reflecting substances include white substances, specifically, titanium oxide, silicon oxide, zirconium oxide, potassium titanate, aluminum oxide, aluminum nitride, boron nitride, mullite, and the like. The amount of a light reflecting substance contained in the resin material can be suitably adjusted by considering the thickness of the cover member 40, the size of the light emitting element, and the like.

Light Transmissive Member 50

A light transmissive member 50 is a member disposed on or above the light source 30 and is used together with the light reflecting layer 60 described later to control the light distribution characteristics of the light emitting device 10. The light transmissive member 50, in particular, can laterally propagate the light emitted from the emission face 31L of the light source.

In the case in which the light source 30 is configured only as a light emitting element 31, the light transmissive member 50 is disposed on the upper face of the light emitting element 50 in the case. In the case in which the light source 30 includes a wavelength conversion member 34, the light transmissive member 50 is disposed on or above the upper face of the wavelength conversion member 34 directly or via another member. The light transmissive member 50, in the case in which disposed directly, i.e., disposed in contact with the upper face of the wavelength conversion member 34 or the light emitting element 31, can be disposed by direct bonding which joins the members at room temperature.

A light transmissive adhesive can be used to indirectly dispose the light transmissive member. For such a light transmissive adhesive, for example, one identical or similar to any of the examples for the fourth light transmissive member described above can be used.

The light transmissive member 50 is preferably a sheet-shaped member whose upper and lower faces are parallel with one another, for example, but can have a face that is not in parallel in part or whole. For example, there can be a slight height difference between the upper face and the lower face. The height difference of about 1% to about 10% of the thickness of the light transmissive member 50 is allowed. The upper face or the lower face of the light transmissive member 50 can be inclined by 10 degrees at most relative to the other. The thickness of the light transmissive member 50 can be suitably adjusted based on, for example, the size of the light emitting element, the size and thickness of the wavelength conversion member, and the side of the light emitting device. For example, the light transmissive member 50 can have a thickness that is 10% to 80%, preferably 20% to 60%, of the maximum width of the emission face of the light source (in the case in which a wavelength conversion member 34 is included, the maximum width of the wavelength conversion member 34). The thickness of the light transmissive member 50 can specifically be 200 µm to 2000 µm, preferably 300 µm to 1000 µm, more preferably 350 µm to 600 µm. From another perspective, the thickness of the light transmissive member 50 can be about 20% to about 80% of the thickness of the light emitting device 10.

Setting the thickness of the light transmissive member 50 as described above allows the light exiting the lateral faces of the light emitting device 10 to advance farther. The light exiting the lateral faces of the light transmissive member 50 can mainly be divided into a direct light component which advances directly from the emission face 31L of the light source to the lateral faces of the light transmissive member 50, and an indirect light component which includes the reflected and scattered light after hitting the light reflecting layer 60 described later and the light reflected and scattered by the upper face of the cover member located around the light source before hitting and exiting the lateral faces of the light transmissive member 50. The direct light component can increase the light extracted from the light emitting device in a lateral direction as well as being extracted upwards. In other words, the light can be extracted diagonally upwards when the light emitting device is viewed in a cross section. This may make it easy to achieve batwing light distribution characteristics, and may make it possible to easily achieve various batwing light distribution characteristics by adjusting the thickness of the light transmissive member relative to the maximum width of the emission face 31L (or the wavelength conversion member), which changes the percentages of the direct and indirect light components. A lateral direction in the context of this embodiment primarily means a horizontal direction or exact lateral direction without limiting it to a horizontal direction or exact lateral direction, i.e., includes directions that are diagonally downwards and diagonally upwards.

The thickness of the light transmissive member 50 is preferably constant across the entire body.

The lateral faces of the light transmissive member 50 are preferably perpendicular to the upper face or the lower face. However, the lateral surfaces can have an angle of inclination of 10 degrees at most relative to the upper or lower face, curved faces, or a combination of both.

The planar area of the light transmissive member 50, for example, is preferably 100% to 1000% of the planar area of the emission face of the light emitting element 31, more preferably in the range of from 300% to 700%. The planar area of the light transmissive member 50, for example, is preferably 100% to 500% of the planar area of the wavelength conversion member 34, more preferably in the range of from 150% to 450%. The light transmissive member 50 is preferably disposed such that the center (or the center of gravity) is aligned with the center (or the center of gravity) of the upper face of the light emitting element 31 and/or the center (or the center of gravity) of the upper face of the wavelength conversion member 34, i.e., the center (or the center of gravity) of the emission face of the light source. The larger the planar area of the light transmissive member 50 than the planar area of the emission face of the light emitting element 31 and/or the planar area of the wavelength conversion member 34, the less the color non-uniformity results based on the observation of the light from the emission face.

The light transmissive member 50 is preferably in contact with the upper face of the cover member 40 directly or via another member in addition to being in contact with the upper face of the light emitting element 31 or the wavelength conversion member 34 directly or via another member. The light transmissive member is preferably disposed from the upper face of the light emitting element 31 or the wavelength conversion member to the upper face of the cover member 40. From another perspective, the light transmissive member is preferably disposed on the upper face in which the upper face of the light emitting element 31 or the wavelength conversion member is integral with the cover member. The lateral faces 51 of the light transmissive member 50 are preferably flush with the lateral faces of the cover member 40. Here, being flush includes a tolerance of unevenness, for example, of about 1% to 10% of the thickness of the light transmissive member 50. This can facilitate the extraction of light from the lateral faces 51 by efficiently introducing the light from the light source 30 into the light transmissive member 50 to be efficiently reflected by the reflecting layer 60 described later.

The light transmissive member 50 can have a transmittance of at least 70% for the light from the light source 30, preferably at least 80%, more preferably at least 90%.

A light transmissive resin material, glass, or the like can be used for the light transmissive member 50. Examples include thermosetting resins, such as silicone resins, silicone modified resins, epoxy resins, and phenol resins, and thermoplastic resins, such as polycarbonate resins, acrylic resins, methylpentane resins, and polynorbornene resins. Among these examples, silicone resins which excel in light resistance and heat resistance are preferable. It is preferable for the light transmissive resin 50 to not substantially contain the phosphors described later. It is preferable for the light transmissive resin to not contain diffusers or the like. However, the light transmissive resin can contain diffusers or the like. In the case of configuring the light transmissive member 50 only as a resin material or glass, the scattering of light within the light transmissive member 50 can be reduced, and the light reflected by the lower face of the light reflecting layer 60 described later and the upper face of the cover member 40 can efficiently be output from the lateral faces 51 of the light transmissive member 50.

Light Reflecting Layer 60

A light reflecting layer 60 is a member disposed on or above the light transmissive member 50. The light reflecting layer 60 preferably covers the entire upper face of the light transmissive member 50. The light reflecting layer 60 is preferably disposed directly in contact with the upper face of the light transmissive member 50 or via another member. The light reflecting layer 60 can reflect the light from the light source 30 towards the lateral faces 51 of the light transmissive member 50 which are emission faces.

The light reflecting layer 60 can have a reflectance of at least 50% for the light from the light source 30, preferably at least 70%, more preferably at least 90%. The light reflecting layer 60 preferably has a thickness such that the transmittance of the light from the light source 30 is 50% at most, 40% at most, or 30% at most. The light reflecting layer 60 preferably has a transmittance higher than 0% for the light from the light source 30, more preferably at least 10% or 15%. This can allow the light exiting the light transmissive member to be mixed with the light that transmits through the light reflecting layer, thereby improving the luminance uniformity when the light source is viewed as a plane from the above.

The light reflecting layer 60 can be formed with, for example, a resin material containing a light reflecting substance, a metal material, an inorganic material using a dielectric multilayer film, or the like. Among the examples, a white material is preferably used for the light reflecting layer 60, more preferably formed with a resin material containing a light reflecting substance.

Such a light reflecting substance and resin material can be selected from those described as examples for the cover member 40. In the case of a metal material, one having a high reflectance is preferable, and examples include silver, aluminum, rhodium, gold, copper, or any alloy of these. Examples of dielectric multilayer films include those employing titanium oxide, silicon oxide, zirconium oxide, potassium titanate, aluminum oxide, aluminum nitride, and the like.

The light reflecting layer 60 has an upper face and a lower face that are parallel to the emission face of the light source 30, i.e., it preferably has a uniform thickness. The upper face or the lower face of the light reflecting layer 60 can have uneven surfaces (i.e., surfaces having protrusions and depressions). Alternatively, the light reflecting layer is shaped to protrude towards the emission face. This can facilitate the reflection of the light from the light source 30 in a lateral direction relative to the light emitting device 10. The unevenness of the upper or lower face of the light reflecting layer 60 can occupy, for example, about 1% to about 20% of the thickness (the maximum thickness) of the light reflecting layer 60.

In the case in which the thickness of the light reflecting layer 60 is not uniform, the thinnest portion preferably has such a thickness that its transmittance is 50% at most for the light from the light source 30.

In the case of using a resin material containing a light reflecting substance for the light reflecting layer 60, the transmittance would vary depending on the composition and the content of the light reflecting substance. It is thus preferable to adjust the thickness or the like in accordance with the materials employed. For example, in the case in which the light reflecting layer 60 is formed of a resin material containing a light reflecting substance, and has a uniform thickness, the thickness can be in the range of from 100 µm to 500 µm, preferably in the range of from 100 µm to 300 µm.

Light Transmissive Cover Member 70

A light transmissive cover member 70 includes a lens part 71. The lens part here is a part where the light is refracted to disperse or converge, and is the surface opposite to the surface that faces the light source and the substrate. The lens part 71 normally has a spherical or curved surface and an annular shape or a ring-like shape with a depressed central portion to surround the light source 30. This can provide the light emitting device 10 with an emission face 360 degrees around the light emitting device 10 in a top view.

The light transmissive cover member 70 can have, in addition to the lens part 71, a portion that is a flat face or approximately flat face where the optical axis of the light emitting element 31 passes through. An approximately flat face here can include a flat face whose surface has an uneven surface (i.e., surface having protrusions and depressions). The unevenness, for example, can occupy about 1% to 20% of the maximum thickness of a portion of the light transmissive cover member 70 disposed on the light reflecting layer 60 where the optical axis of the light emitting element 31 passes through.

Figure 5A:
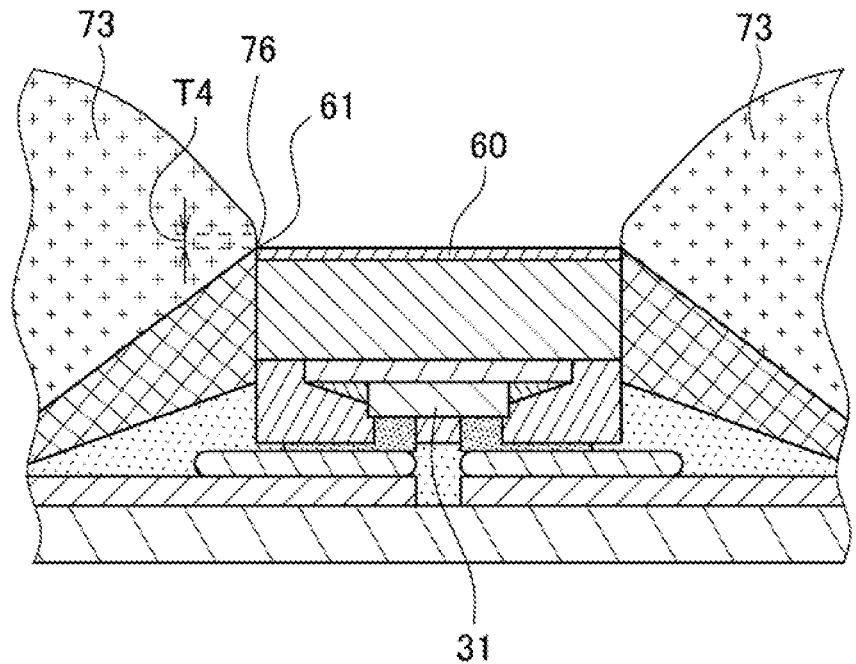
FIG. 5A is an enlarged schematic cross-sectional view of a portion of a light emitting device according to another embodiment.
Figure 5B:
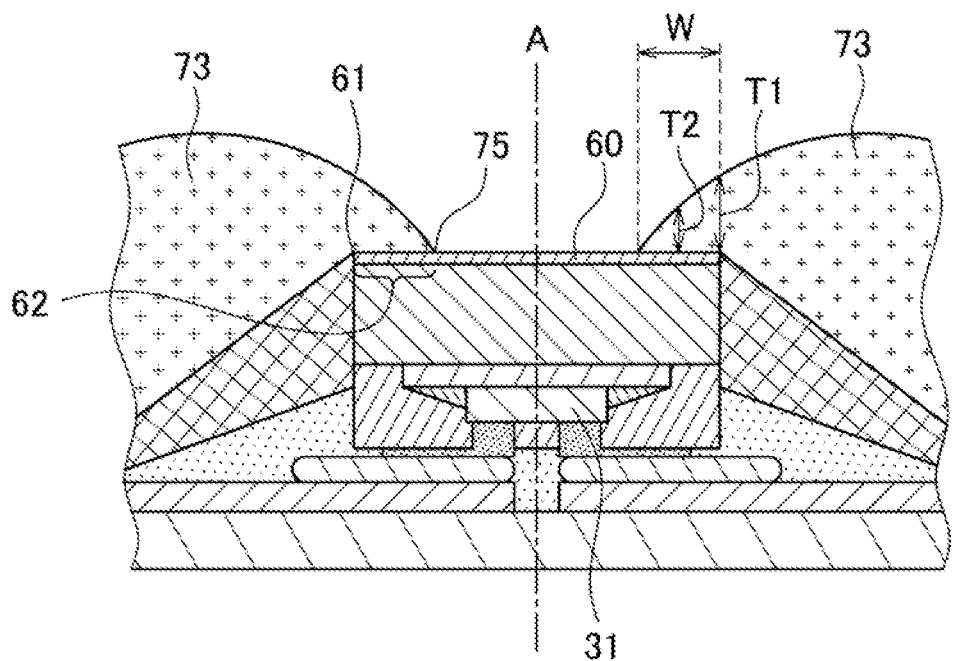
FIG. 5B is an enlarged schematic cross-sectional view of a portion of the light emitting device in FIG. 1B.

The light transmissive cover member 70 preferably covers at least the lateral faces 51 of the light transmissive member 50 in part or whole. Moreover, the light transmissive cover member 70 can cover the lateral faces of the light reflecting layer 60 in part or whole, the upper face of the light reflecting layer 60 in part or whole, and the cover member 40 in part or whole. Among all, as shown in FIG. 1B, the light transmissive cover member 70 preferably covers the lateral faces of 51 of the light transmissive member 50 in whole, the lateral faces of the light reflecting layer 60 in whole, and the lateral faces of the cover member 40 in part. In this case, the light transmissive cover member 70 has an annular structure, as shown in FIG. 1 and FIG. 5A, such that its inner perimeter 76 coincides with the perimeter 61 of the light reflecting layer 60. Alternatively, as shown in FIGS. 1B and 5B, the inner perimeter 75 can cover the peripheral region 62 of the upper face of the light reflecting layer 60. In other words, the light transmissive cover member 70 covers at least the perimeter 61 of the light reflecting layer 60 while exposing a portion of the upper face of the light reflecting layer 60. This portion of the upper face of the light reflecting layer 60 preferably includes area where the optical axis of the light emitting element 31 passes through.

By forming the light reflecting layer 60 with a white resin containing a reflecting substance and disposing such a light transmissive cover member, the luminance uniformity when viewed the light source from the above can be further improved. For example, in a backlight application, in the case of disposing a diffusion sheet or the like above the light emitting device, the light reflected by the diffusion sheet can be scattered in the light reflecting layer 60, thereby producing uniform light without color non-uniformity. To explain in more detail, the light emitting device or package structured in this embodiment can allow the light to exit from the lateral faces of the light transmissive member within the light transmissive cover member, and thus a small percentage of light transmits through the light reflecting layer to exit upwards. Accordingly, the area where the optical axis of the light emitting element passes through may be less bright than the remaining area when the light source is viewed from the above. In the case in which the light emitting device or the package is used as a surface emitting device having a diffusion sheet or the like disposed above the light source, in particular, the area where the optical axis of a light emitting element passes through may appear as a dark spot when the emission face of the diffusion sheet is viewed from the above. According to this embodiment, such a dark spot can be reduced, and the luminance uniformity can be improved when the light emitting device or surface emitting device is viewed from the above. The luminance uniformity can be particularly improved when the light transmissive cover member 70 exposes (has a thickness of 0 µm) a portion of or the entire upper face of the light reflecting layer 60.

Figure 5C:
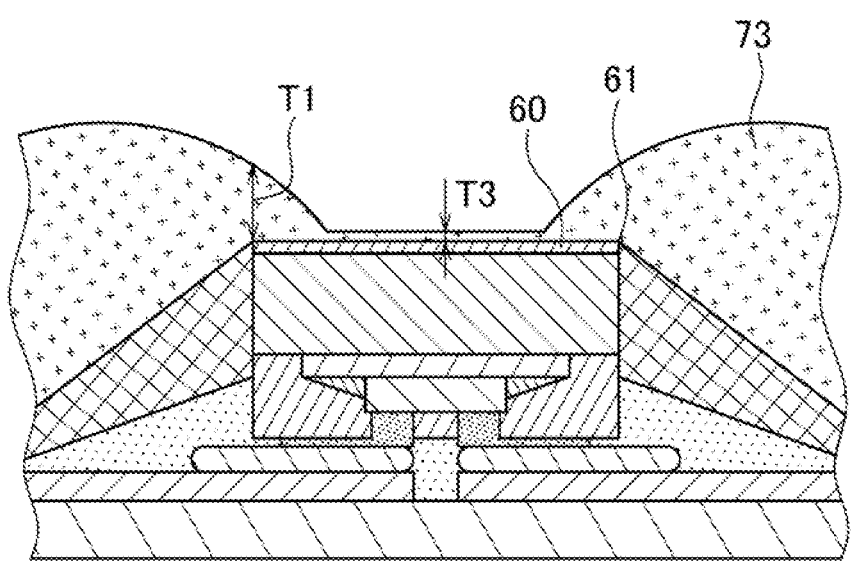
FIG. 5C is an enlarged schematic cross-sectional view of a portion of a light emitting device according to another embodiment.

In the case in which the light transmissive cover member 70 covers the upper face of the light reflecting layer 60 while exposing a portion thereof, the exposed area can be 100% of the upper face of the light reflecting layer 60, but can be at least 50%, more preferably at least 60%. In other words, the width of the peripheral region 62 (i.e., the distance from the perimeter 61 of the light reflecting layer 60 to the inner perimeter 75 of the light transmissive cover member 70 in FIG. 5B) can be 5% to 90% of the maximum width of the light reflecting layer 60. Moreover, in the case in which the light transmissive cover member 70 covers the upper face of the light reflecting layer 60, as shown in FIG. 5C, or FIG. 5B in which the light transmissive cover member 70 exposes at least one portion, i.e., the area where the optical axis of the light emitting element 31 passes through, of the upper face of the light reflecting layer 60, the thickness T1 above the perimeter 61 of the light reflecting layer 60 is preferably larger than the thicknesses T2 and T3 above the upper face of the light reflecting layer 60. Particularly, the thickness T1 is more preferably larger than the thickness T3 above the light reflecting layer 60 where the optical axis A of the light emitting element passes through.

As shown in FIG. 5A, even in the case in which the inner perimeter 76 of the light transmissive cover member 70 coincides with the perimeter 61 of the light reflecting layer 60, the thickness T4 of the light transmissive cover member 70 above the perimeter 61 of the light reflecting layer 60 is larger than the thickness (0 µm) on the upper face of the light reflecting layer 60.

For example, the maximum thickness of the light transmissive cover member 70 in the Z direction (TX in FIG. 1B) can be in the range of from 300 µm to 5000 µm, more preferably in the range of from 800 µm to 2500 µm.

The maximum width of the light transmissive cover member 70 above the substrate 20 (WX in FIG. 1B) can be suitably adjusted based on the size and luminance of the light source 30, but can be in the range of from 1 mm to 10 mm, for example, more preferably in the range of from 2 mm to 8 mm.

Figure 2:
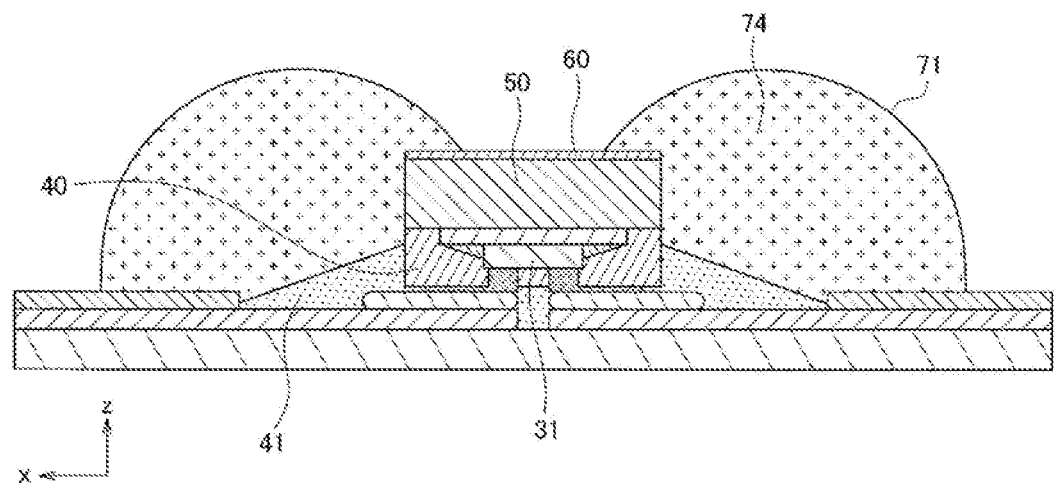
FIG. 2 is a schematic cross-sectional view of a light emitting device according to another embodiment of the present disclosure.

The light transmissive cover member 70, as shown in FIG. 1B for example, can include a second light transmissive member 72 covering the lateral faces of the light transmissive member 50, and includes a third light transmissive member 73 covering the second light transmissive member 72 and configuring the lens part 71. As shown in FIG. 2, the light transmissive cover member 70 can be formed of a fifth light transmissive member 74 in which the second and third light transmissive members are monolithically formed using the same material.

For example, the transmittance of the second light transmissive member 72, the third light transmissive member 73, and the fifth light transmissive member 74 that compose the light transmissive cover member 70 for the light from the light emitting element can be at least 70%, preferably at least 80%, more preferably at least 90%.

The second light transmissive member 72, the third light transmissive member 73, and the fifth light transmissive member 74 can be formed by using similar materials to those described as examples for the light transmissive member 50. For the second light transmissive member 72, in particular, a material having a lower refractive index than a reflective index of the material used to form the third light transmissive member 73 is preferably selected among those described as examples for the light transmissive member 50. By selecting such a material, light can be refracted upwards, which allows the light from the light source to be more effectively utilized. Providing a second light transmissive member 72 can prevent air bubbles from forming in the lens part 71 of the light transmissive cover member 70. It can prevent entrapped voids, particularly in potting. The viscosity of the light transmissive cover member 70 is preferably adjusted by containing a filler in the materials described above in order to regulate the shape. Above all, the third light transmissive member 73 is preferably more viscous and thixotropic than the second light transmissive member 72.

The second light transmissive member 72 preferably has a varying thickness. It can have a uniform thickness across the entire body. One example of the second light transmissive member 72 has such a shape that the thickness is largest in the region closer to the light transmissive member 50 and gradually decreases in a linear manner to the smallest thickness at the farthest point from the light transmissive member 50. Such a thickness gradient can diffuse the light emitted from the light transmissive member 50 more laterally and upwards.

The light transmissive cover member 70 can be formed by methods known in the art. Among all, potting is a preferable method. Examples include a method in which a nozzle for discharging a material for forming the light transmissive cover member is moved while discharging the material so as to draw a circle around the light source 30 which includes the cover member 40, the light transmissive member 50, and the light reflecting layer 60, and a method in which multiple nozzles, e.g., 4, 6, or 8 nozzles, are used to discharge the material and the sections of the material discharged by adjacent nozzles are connected. Using such a method, the light transmissive cover member 70 can be easily formed to have an intended shape.

Light Reflecting Member 41

The light emitting device 10 preferably further includes a light reflecting member 41 between the substrate 20 and the cover member 40, and between the substrate 20 and the light transmissive cover member 70. Even if a light absorbing material is disposed around the light emitting element 31 as the substrate 20, the light reflecting member 41 provided can cover the light absorbing material, thereby efficiently inhibiting the light emitted from the light source from being absorbed.

The light reflecting member 41 can be disposed on any of the base 22, the wiring 21, the cover layer 23, the bonding member 24, and the like, but preferably disposed on all. Furthermore, it is preferably disposed also on the substrate 20 immediately under the light emitting element 31. The light reflecting member 41 can have a uniform or varying thickness on the substrate 20. One example of the light reflecting member 41 has such a thickness that is largest near the light source and gradually decreases in a linear manner to the smallest thickness at the farthest point from the light source. Such a thickness gradient can diffuse the light emitted from the light transmissive member 50 more laterally and upwards. This can provide a light emitting device capable of emitting bright light while diffusing more widely in a lateral direction.

In the case of disposing a light reflecting member 41 in this manner, a portion of the light transmissive cover member 70 is positioned on the light reflecting member 41, while positioning another portion on the cover layer 23 of the substrate 20 (e.g., FIG. 1B). As shown in FIG. 1C, the entire light transmissive cover member 70 can be disposed on the light reflecting member 41. In this case, the light reflecting member 41 extends on the upper face of the cover layer 23 of the substrate 20. This can make it easy to dispose the light transmissive cover member 70 having an appropriate shape in an appropriate location. FIG. 1C, similar to FIG. 1B, is a schematic cross-sectional view of another embodiment taken along I-I' in FIG. 1A which is a perspective view of a light emitting device.

Furthermore, the light reflecting member 41 is preferably less viscous and thixotropic than the viscosity and thixotropic the second light transmissive member 72. In this manner, the gradient described above can easily be achieved.

Figure 6A:
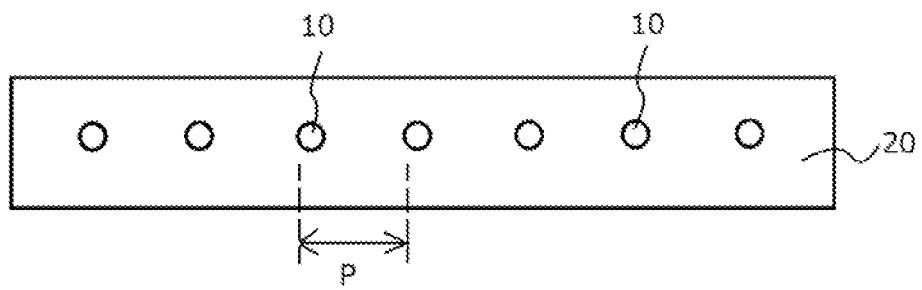
FIG. 6A is a schematic top view of a light emitting device according to another embodiment.
Figure 6B:
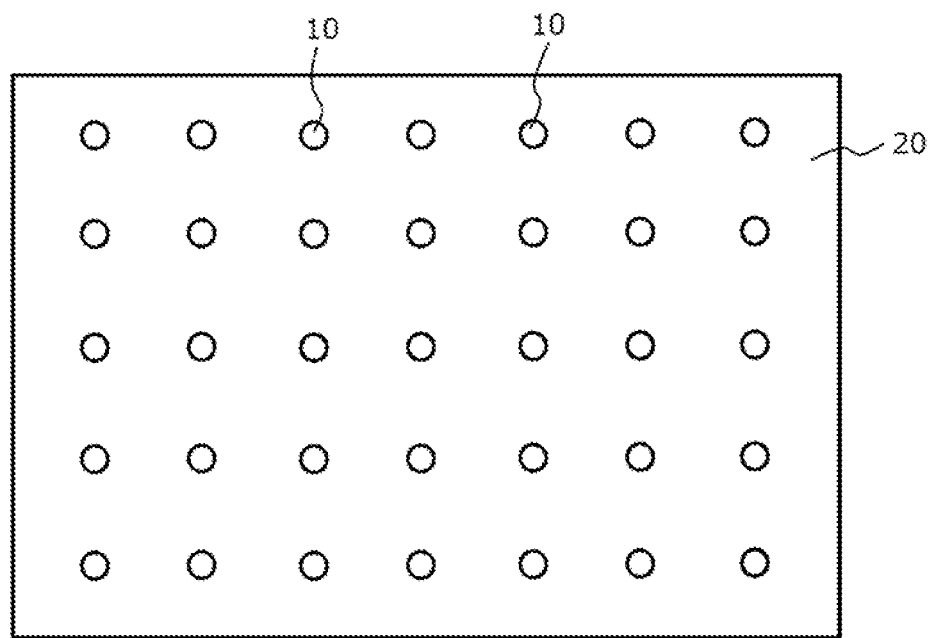
FIG. 6B is a schematic top view of a light emitting device according to yet another embodiment.

A number of light emitting devices 10 described above can be arranged on a substrate. In this case, the light emitting devices 10 can be arranged in a row on a substrate 20 as shown in FIG. 6A or a matrix as shown in FIG. 6B. The light emitting devices 10 are preferably arranged using the same pitch. Alternatively, the light emitting devices 10 can be arranged using different pitches. The pitch for the light emitting devices 10 can be suitably adjusted depending on the size, brightness, or the like of the light emitting devices. For example, the pitch (P in FIG. 6A) for the light emitting devices 10 can be in the range of from 5 mm to 100 mm, preferably in the range of from 15 mm to 50 mm.

Figure 7:
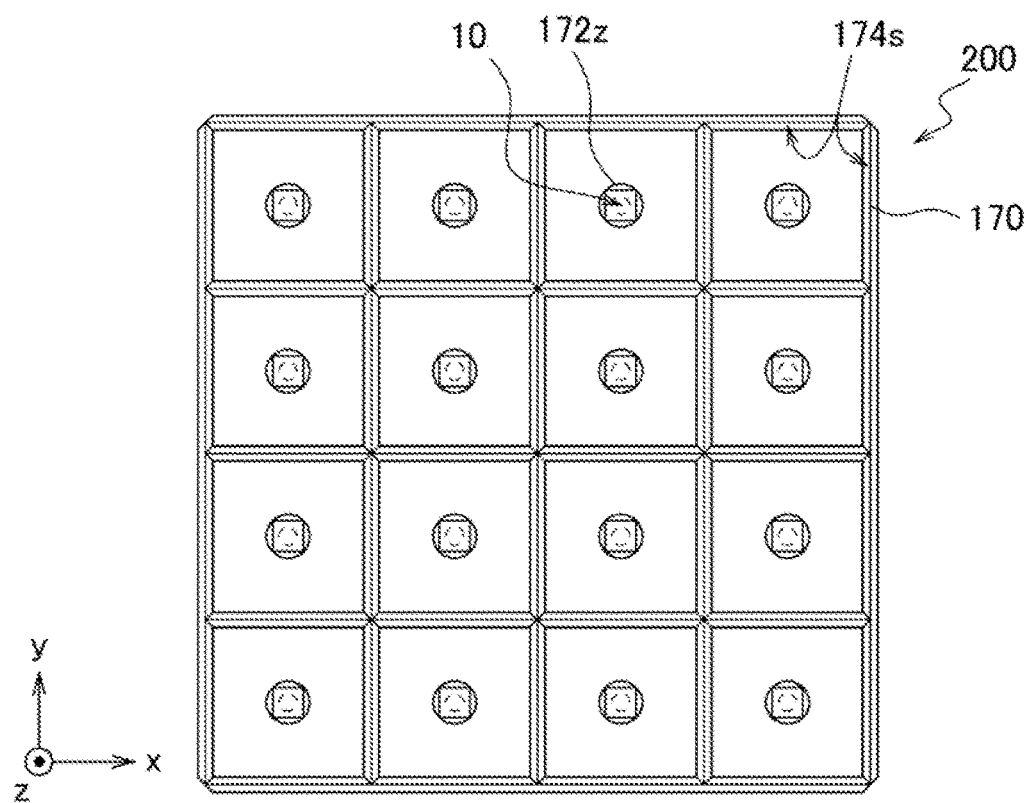
FIG. 7 is a schematic top view of an integrated light emitting device having a two-dimensional array of the light emitting devices shown in FIG. 1C.

FIG. 7 shows an example of an integrated light emitting device which has two dimensionally arranged light emitting devices 10 shown in FIG. 1B or 1C. The integrated light emitting device 200 shown in FIG. 7 includes 16 light emitting device units each having a similar structure to that shown in FIG. 1C, and the units are arranged in four rows by four columns in an XY plane in the drawing. As shown in the drawing, the light emitting devices each include a second reflecting member 170 which has oblique faces 174s. The oblique faces 174s extend in the X direction and Y direction in the drawing, and each light emitting device 10 is surrounded by four of the oblique faces 174s.

The integrated light emitting device 200, which is a surface emission light source including emission regions arranged in four rows by four columns, is useful as a backlight for a liquid crystal display device. As shown in FIG. 7, the structure in which each light emitting device 10 is surrounded by the oblique faces 174s can reduce the luminance non-uniformity in each emission region as well as the luminance non-uniformity in a group of emission regions.

Figure 8:
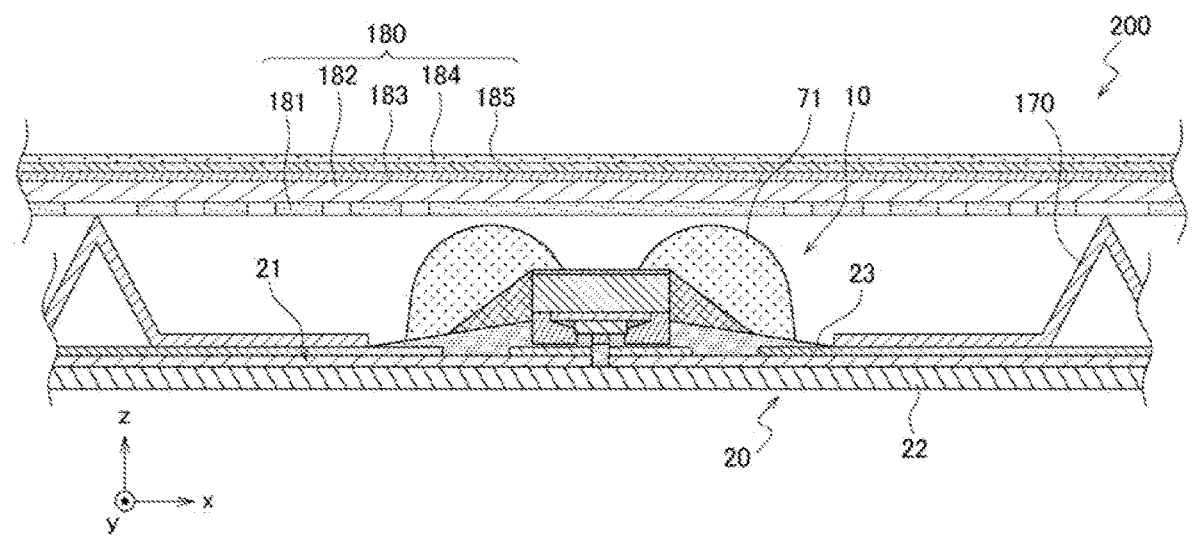
FIG. 8 is an enlarged schematic cross-sectional view of a portion of the integrated light emitting device shown in FIG. 7.

FIG. 8 is a cross-sectional view showing one of the light emitting devices 10 in the integrated light emitting device 200. The integrated light emitting device 200 includes a plurality of two-dimensionally arranged light emitting devices 10. The light emitting devices 10 include a layered optical body 180. The layered optical body 180, for example, includes a half mirror 181, a diffusion sheet 182, and at least one prism sheet 183. In the example shown in FIG. 8, the layered optical body 180 further includes a prism sheet 184 and a polarizing sheet 185. A half mirror 181 is preferably positioned on the substrate 20 side where the light emitting device 10 is supported, and the prism sheet 183 is preferably positioned on the output face side. The diffusion sheet 182 is preferably positioned between the half mirror 181 and the prism sheet 183.

Figure 9:
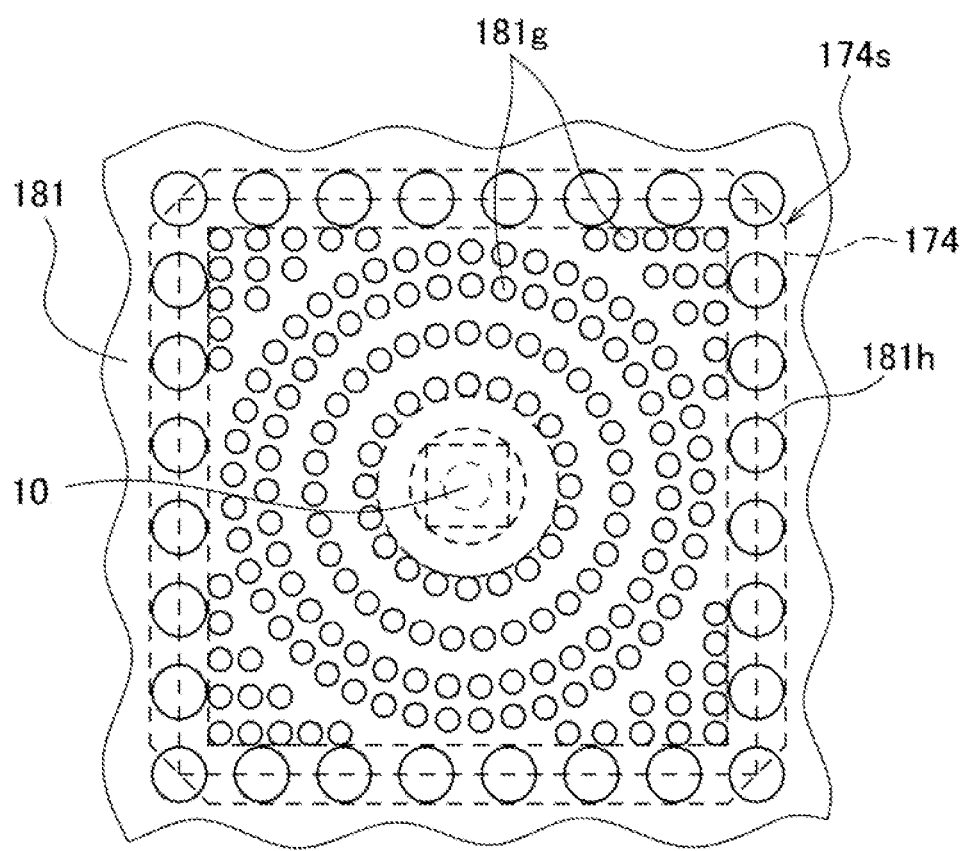
FIG. 9 is an enlarged schematic top view of a portion of the layered optical body used in the integrated light emitting device shown in FIG. 8.

The half mirror 181 transmits a portion of the light entering from the substrate 20 side, while reflecting a portion towards the substrate 20. FIG. 9 is a schematic plan view of the half mirror 181. The half mirror 181 has a plurality of holes 181h and 181g formed in a primary face. In this embodiment, the holes 181h and 181g are those that physically pass through from one primary face to the other primary face, where the half mirror 181 does not substantially reflect light, but transmits light in the regions corresponding to the holes 181h and 181g. Accordingly, the transmittance and reflection characteristics of the half mirror 181 can be two-dimensionally distributed by the sizes, numbers, and positions of the holes 181h and 181g, to thereby allow the light entering from the substrate side to enter the diffusion sheet 182 with less the illuminance non-uniformity and color non-uniformity. In the case of composing a half mirror 181 with a light transmissive substrate and a dielectric multilayer film disposed on the substrate, similar optical characteristics can be achieved by not disposing the dielectric multilayer film in the regions corresponding to the holes 181h and 181g without creating any holes in the substrate.

In the example shown in FIG. 9, the holes 181h are larger than the holes 181g and are provided above the walls 174 that surround the light emitting device 10 on four sides. The walls 174 include the oblique faces 174s of the second reflecting member 170. The holes 181g are formed concentrically around the light emitting device 10. The holes 181g are also formed in the corner areas of the square surrounded by the walls 174. By forming larger diameter holes 181h above the walls 174, the light from one light emitting element section is allowed to leak into adjacent light emitting element sections at the boundaries along the walls 174 to make the boundaries of the sections defined by the walls 174 less distinguishable.

The diffusion sheet 182 diffuses the light transmitting through the half mirror 181 in the direction of advance to reduce the illuminance non-uniformity and color non-uniformity. The prism sheets 183 and 184 change the direction of advance of the light entering thereto to exit in the normal direction. Disposing the prism sheets 183 and 184 so as to be orthogonal to one another allows the light to exit in the front direction to a greater degree, thereby increasing the luminance in the front direction. By reflecting S-waves and transmitting P-waves of the entering light, for example, the polarizing sheet 185 aligns the polarization directions of the exiting light to thereby increase the luminance of the light emitted from the light emitting device 10 at a specific plane of polarization. This is particularly effective in the case of using the integrated light emitting device 200 as a backlight for a liquid crystal panel.

Figure 10A:
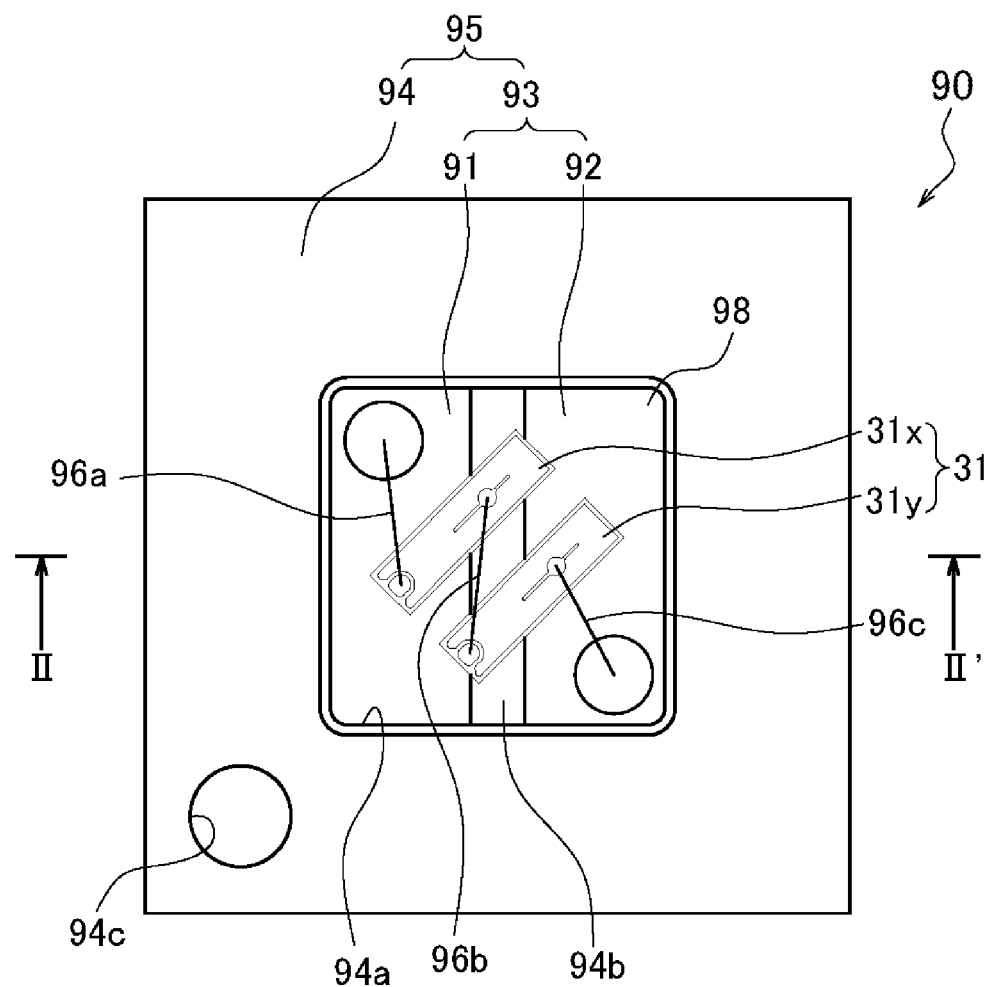
FIG. 10A is a schematic top view of a light source used in the light emitting device according to another embodiment of the present disclosure.
Figure 10B:
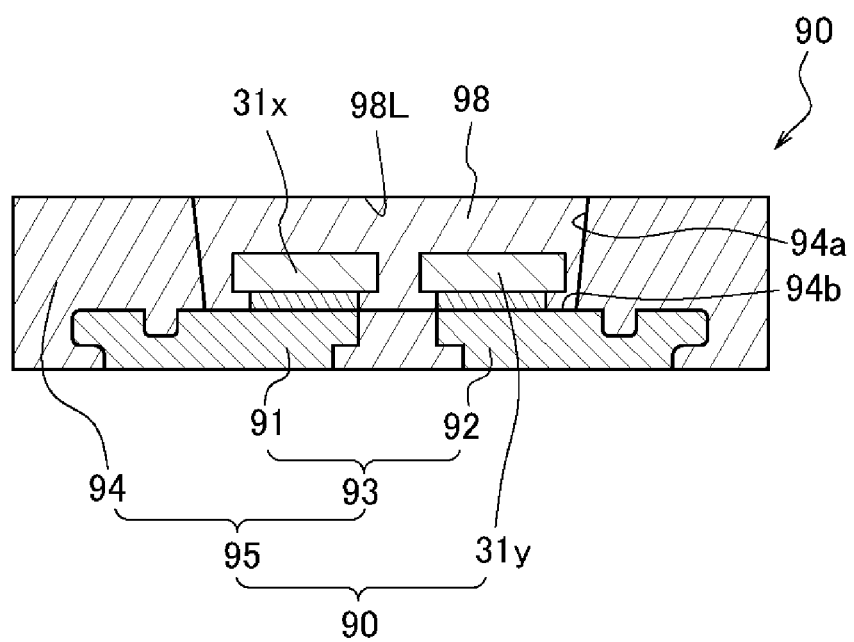
FIG. 10B is a schematic cross-sectional view taken along the line II-IF of FIG. 10A.

As shown in FIGS. 10A and 10B, a light source 90 used in a light emitting device according to another embodiment of the present disclosure can include light emitting element 31, and a resin package 95 that includes leads 93 and resin member 94. The light source 90 can includes a wire 96a connecting the lead 93 and the light emitting element 31, or the like.

The resin member 94 supports the leads 93. The leads 93 includes a first lead 91 and a second lead 92. The resin package 95 has a recess 94a defined by a bottom face 94b configured as a portion of the first lead 91, a portion of the second lead 92, and a portion of the resin member 94, and defined by lateral wall(s) configured as a portion of the resin member 94. In the upper face of the lateral wall of the resin member 94, an opening is defined by a portion of a bottomed hole. The opening of the resin member 94 can be used as a cathode mark 94c. The cathode mark 94c can alternatively be used as an anode mark.

The shape of the recess 94a of the resin member 94 is not particularly limited, but the bottom face 94b can have a quadrangular shape, especially a square, in a top view.

The light emitting element 31 is disposed on the bottom face 94b defining the recess 94a. In FIGS. 10A and 10B, two of the light emitting elements 31 (i.e., light emitting element 31x and light emitting element 31y) are disposed, however, the number of the light emitting elements can be one or more. The shape of the light emitting elements 31 in a top view is not particularly limited, however, can be rectangular as an example. In FIGS. 10A and 10B, the two light emitting elements 31 are each disposed so as to straddle the first lead 91 and the second lead 92. The two light emitting elements 31 are connected series. Specifically, the first lead 91 and the light emitting element 31x are connected by the wire 96a, the light emitting element 31x and the light emitting element 31y are connected by a wire 96b, and the light emitting element 31y and the second lead 92 are connected by a wire 96c. The wires can be formed of, for example, gold, copper, silver, platinum, aluminum, palladium, or alloys containing at least one metal thereof. Specifically, it is beneficial to use a wire containing both gold and silver. In the case in which the wire contains both gold and silver, content of silver can be, for example, in the range of from 15% to 20%, in the range of from 45% to 55%, in the range of from 70% to 90%, or in the range of from 95% to 99%. In the recess 94a, an encapsulating member 98 is provided. The upper face of the encapsulating member 98 serves as a light emission face 98L. The encapsulating member 98 can contain at least one wavelength conversion material. Alternatively, a layer containing the at least one wavelength conversion material can be provided between the encapsulating member 98 and the light emitting elements 31.

Figure 11:
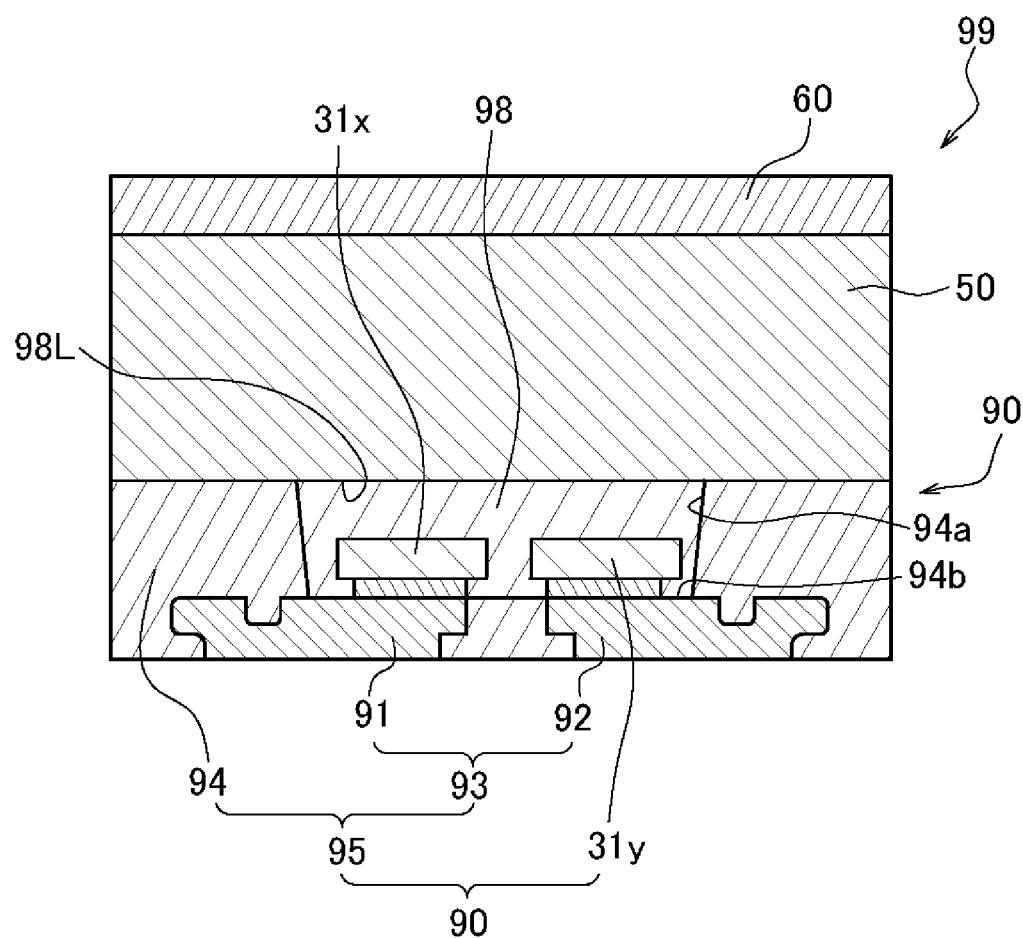
FIG. 11 is a schematic cross-sectional view of an LED package according to another embodiment in which the light source of FIG. 10A is used.

As shown in FIG. 11, an LED package 99 is configured as the light source 90 described above is disposed on the substrate 20, the light transmissive member 50 is disposed on the light source 90, the light reflecting layer 60 is disposed on the light transmissive member 50.

The light transmissive member 50 disposed on the light source 90 is in contact with the light emission face 98L and the upper face of the lateral wall of the resin member 94. The light transmissive member 50 can be positioned in the cathode mark 94c of the resin member 94. Such a structure may allow the cathode mark 94c to exert anchoring effect to the resin member 94. Accordingly, adhesion between the light source 90 and the light transmissive member 50 may be enhanced.

The thickness of the light transmissive member 50 can specifically be in the range of from 200 μm to 2000 μm, preferably in the range of from 300 μm to 1000 μm, more preferably in the range of from 350 μm to 600 μm. The ratio of the area of the upper face of the encapsulating member 98 relative to sum of the areas of the upper face of the encapsulating member 98 and the upper face of the lateral wall of the resin member 94 is preferably in the range of from 0.25 to 0.5, in a top view.

Figure 12:
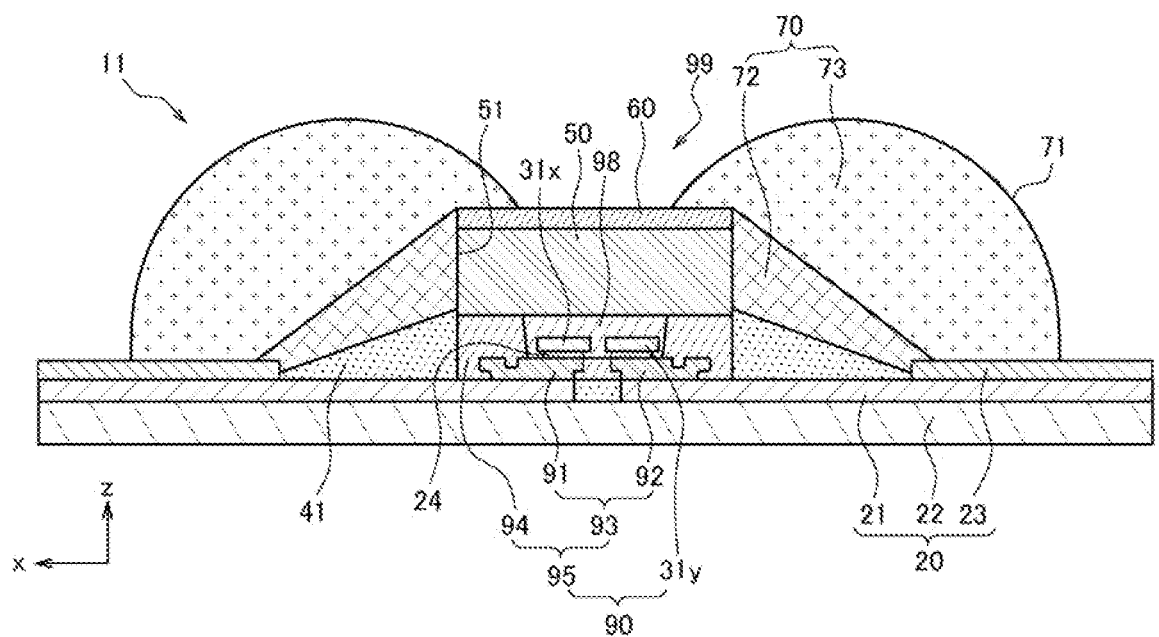
FIG. 12 is a schematic cross-sectional view of a light emitting device according to another embodiment.

As shown in FIGS. 11 and 12, an LED package 99 according to another embodiment of the present disclosure can includes the substrate 20, the light source 90 disposed on the substrate 20, and the light transmissive cover member 70 including the annular lens part 71 disposed on the LED package 99. The substrate 20 includes the wire 21, the base 22 on which the wire 21 is disposed, and the cover layer 23.

The light transmissive cover member 70 can includes the second light transmissive member 72 covering the lateral faces of the light transmissive member 50, and includes the third light transmissive member 73 covering the light second transmissive member 72 and configuring the lens part 71. The lens part 71 covers at least the lateral faces of the light transmissive member 50 and as described above, and has such a shape that a portion above the perimeter of the light reflecting layer 60 has a larger thickness than a thickness of a portion above the light reflecting layer 60 where the optical axis of the light emitting element 31 passes through.

What is claimed is:

1. An LED package comprising:
a light source having an upper face serving as a light emission face, the light source including
  a resin package including a first lead, a second lead, and a resin member supporting the first lead and the second lead, the resin package defining a recess having
    a bottom face defined by a portion of the first lead, a portion of the second lead, and a portion of the resin member, and
    a lateral wall defined by a portion of the resin member,
  a light emitting element disposed on or above the bottom face in the recess, and
  a wavelength conversion material disposed within the recess so as to be surrounded by the lateral wall of the recess;
a light transmissive member disposed on or above the resin package of the light source so that the light transmissive member is disposed on or above the wavelength conversion material of the light source; and
a light reflecting layer disposed on or above the light transmissive member at least on an upper side along an optical axis of the light emitting element.

2. The LED package according to claim 1, wherein the light reflecting layer is made of a resin material containing a light reflecting substance.

3. The LED package according to claim 1, wherein the light source includes a wire connecting the light emitting element with the first lead or the second lead.

4. The LED package according to claim 1, wherein the light source further includes an additional light emitting element, and wires connecting the light emitting element and the additional light emitting element in series.

5. The LED package according to claim 1, wherein the light emitting element has a rectangular shape in a top view.

6. The LED package according to claim 1, wherein the resin package defines a first a part of an outermost lateral face of the LED package, and
the light transmissive member defines a second part of the outermost lateral face of the LED package so that light is transmitted through the light transmissive member and extracted from the LED package through the second part of the outermost lateral face of the LED package.

7. The LED package according to claim 1, wherein the light source further includes an encapsulating member disposed in the recess, the encapsulating member containing the wavelength conversion material.

8. The LED package according to claim 1, wherein the light source further includes an encapsulating member disposed in the recess, and
the wavelength conversion material is arranged between the light emitting element and the encapsulating member.

9. An integrated light emitting device comprising:
the LED package according to claim 1; and
a substrate on which the LED package is arranged.

10. An integrated light emitting device comprising:
a plurality of LED packages with each of the LED packages being configured as the LED package according to claim 1; and
a substrate on which the LED packages are arranged.

11. The integrated light emitting device according to claim 9, further comprising
a layered optical body arranged on a side of the LED package opposite to the substrate.

12. The integrated light emitting device according to claim 11, wherein
the layered optical body includes at least one of a half mirror, a diffusion sheet, and a prism sheet.

13. The LED package according to claim 7, wherein an upper face of the encapsulating member is flush with an upper face of the resin package.

14. The LED package according to claim 13, wherein the light transmissive member covers the upper face of the encapsulating member and the upper face of the resin package.

* * * * *